United States Patent [15] 3,690,546

Uehara [45] Sept. 12, 1972

[54] TEMPERATURE COMPENSATING CIRCUIT FOR AN OSCILLATOR

[72] Inventor: Kiyoshi Uehara, Tokyo, Japan

[73] Assignee: Nippon Electric Company Limited, Tokyo, Japan

[22] Filed: Jan. 6, 1971

[21] Appl. No.: 104,450

[30] Foreign Application Priority Data

Jan. 13, 1970 Japan ........................45/4165

[52] U.S. Cl.....................................331/176, 331/158

[51] Int. Cl.................................................H03b 5/32

[58] Field of Search.......334/15; 331/116, 176, 32 C, 331/158

[56] References Cited

UNITED STATES PATENTS

| | | | |
|---|---|---|---|
| 3,295,070 | 12/1966 | Tewksbury et al. | ........331/179 |
| 3,397,367 | 8/1968 | Steel et al. | .................331/176 |

*Primary Examiner*—John Kominski
*Attorney*—Marn & Jangarathis

[57] ABSTRACT

An automatic frequency control for a crystal tuned oscillator, comprising temperature sensitive means producing an output voltage varying in magnitude over a predetermined environmental frequency range, a crystal oscillator activated by the temperature means varying output voltage to provide a corresponding output frequency deviation over the predetermined environmental frequency range, and series diodes and capacitors or inductors to compensate for the oscillator output frequency deviation, wherein the diodes are biassed to OFF states by different amounts of voltage to disconnect the capacitors or inductors from the crystal when the temperature means output voltage is less than the biasing voltage smallest amount and further wherein the diodes are activated in turn to ON states to connect the capacitors or inductors in turn with the crystal to maintain the oscillator output frequency deviation at substantially zero value over the predetermined environmental frequency range.

10 Claims, 7 Drawing Figures

INVENTOR.
Kiyoshi Uehara

BY
*Marn & Jangarathis*
ATTORNEYS

*INVENTOR.*
Kiyoshi Uehara
*BY*
Marn & Jangarathis
*ATTORNEYS*

TEMPERATURE COMPENSATING CIRCUIT FOR AN OSCILLATOR

This invention relates to a temperature compensating circuit for an oscillator, and more specifically, to a circuit wherein the frequency deciding element of an oscillator is connected to a plurality of semiconductor elements to be switched in response to d.c. voltage changes in a voltage control circuit caused by the environmental temperature change, thereby compensating the oscillator frequency change which would be caused by the environmental temperature change.

Various methods of temperature compensation for oscillators have hitherto been proposed: such as the use of a variable-capacitance diode whose reverse bias voltage is changed according to the environmental temperature change; the use of a bimetal to be deformed by the temperature change, the mechanical power resulted from which is utilized either to effectuate a variable-capacitance characteristic or to switch fixed-value capacitors; and so on. These prior art compensating system, however, have disadvantages exemplified as follows. For the system employing the variable-capacitance diode, it is impossible to obtain all the desired capacitance versus reverse bias voltage characteristics, and therefore, the temperature-dependence characteristic of the d.c. output voltage must be adjusted in accordance with the characteristic of the oscillator frequency to be compensated, thus requiring selection among variable-capacitance diodes of wide-deviating characteristics as well as very complicated adjustments. The mechanical compensation type system using the bimetal, on the other hand, encounters difficulties in manufacture as it utilizes mechanical power caused by temperature changes, hence the limited accuracy of compensation and the bulkiness of structure.

An object of this invention is to provide an improved temperature compensating circuit for an oscillator, wherein any frequency-temperature characteristic can be freely and completely compensated by a simple circuit structure and the above-mentioned disadvantages of the prior art methods are eliminated.

The present invention will now be fully described with reference to the accompanying drawings, wherein:

FIGS. 1(*a*) and (*b*) are circuit diagrams illustrating the operation of semiconductor switching elements;

Figure 1A:
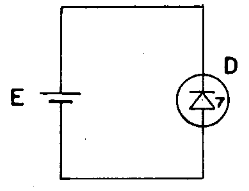
Figure 1B:
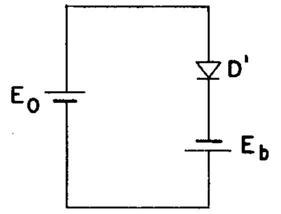

FIG. 1(*a*) is a schematic diagram illustrating the operation of a well-known zener diode as an example of semiconductor diodes to be switched in response to the value of a d.c. voltage. A voltage supply E is connected to a zener diode D in the reverse-bias direction. As is well known, the zener diode will be on-state if $E>V_z$ and be off-state if $E<V_z$, where $V_z$ is the zener voltage of the zener diode D. FIG. 1(*b*) illustrates the switching operation of an ordinary type diode D' with a voltage supply $E_0$ in the forward direction as well as a bias voltage $E_b$ in the reverse direction. The diode will be on-state if $E_0>E_b$ and be off-state if $E_0<E_b$.

Figure 2:
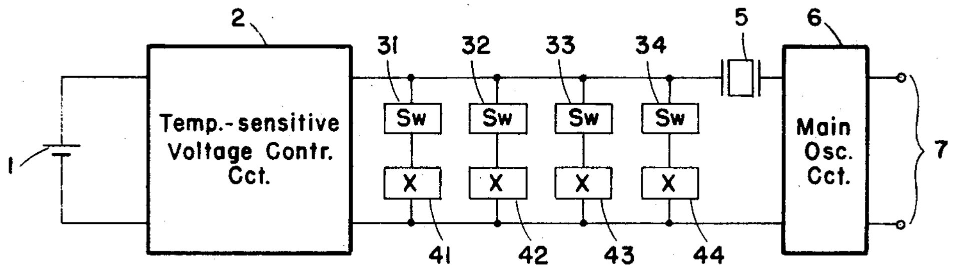
FIG. 2 is a schematic circuit diagram illustrating the fundamental concept of the temperature compensating circuit in accordance with this invention.

FIG. 2 schematically shows the fundamental circuit structure of the temperature compensating circuit of this invention. A d.c. voltage is supplied from a reference voltage source 1 through a temperature-sensitive voltage control circuit 2 to each of semiconductor switching circuits 31 to 34, to which reactance elements 41 to 44 are connected, respectively, all of these reactance elements being connected to a quartz crystal unit 5 in series to constitute a part of an oscillator together with a main oscillation circuit 6. Zener diodes, for example, may be used in these semiconductor switching circuits 31 to 34 with their respective zener voltage $V_z$ slightly different from one another. In response to the output voltage of the temperature-sensitive voltage control circuit those zener diodes whose $V_z$'s are smaller than this output voltage are turned on to connect the associated ones of the reactance elements 41 to 44 to the quartz vibrator 5 in series, thereby controlling the oscillator frequency. Compensation can thus be achieved by choosing the values of the reactance elements 41 to 44 corresponding to the oscillator frequency change to be compensated. It will be evident that the same results can be attained by using ordinary diodes with each reverse bias $E_b$, as shown in FIG. 1(*b*), in the semiconductor switching circuits 31 to 34. Thus, the compensated oscillator output is obtained at output terminals 7.

Figure 3:
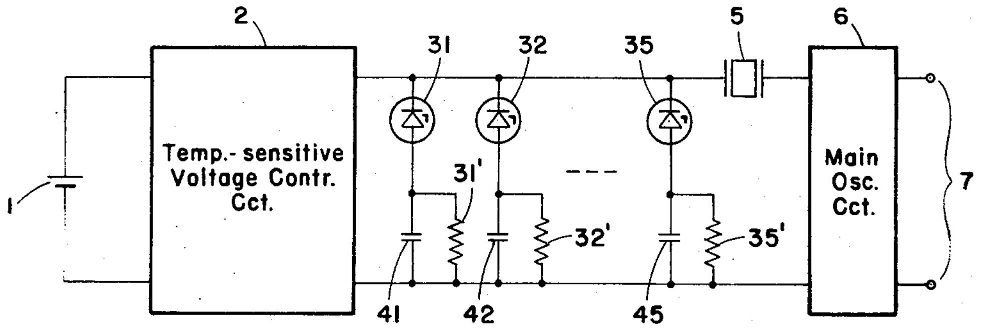
FIG. 3 is a circuit diagram showing an embodiment of the temperature compensating circuit of this invention.
Figure 4:
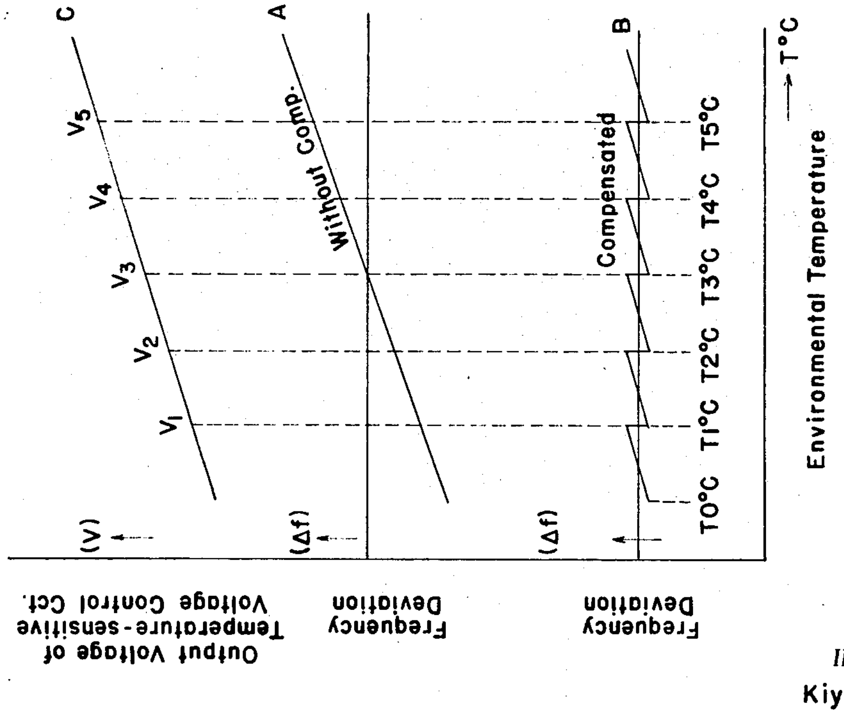
FIG. 4 is a diagram showing the frequency vs. temperature characteristic of the circuit of FIG. 3.

FIG. 3 is a circuit diagram showing an embodiment of the temperature compensating circuit of this invention, in which zener diodes are used as semiconductor switching elements 31 to 35. (For example, RD-4A, RD-6A, RD-8A, . . . , and RD-40A type zener diodes manufactured and put on market by Nippon Electric Co., Ltd. are used.) and capacitors as reactance elements 41 to 45. A d.c. voltage is supplied from a reference voltage 1 through a temperature-sensitive voltage control circuit 2 to each of the zener diodes 31 to 35 in the reverse direction. Capacitors 41 to 45 are connected to the zener diodes 31 to 35, respectively, in series. These five series-connected circuits are connected to a quartz crystal unit 5 in series and further to the main oscillator circuit 6. Resistors 31' to 35' act as protection resistors when the zener diodes 31 to 35 are turned on, and simultaneously as bias resistors for the zener diodes 31 to 35. The temperature-sensitive voltage in a positive and substantially linear proportion to the temperature. Such circuits may comprise thermistors, posistors or the like and may be of the type described in the article entitled "Temperature Compensation of Quartz Crystal Oscillators" by D.E. Newell et al., published in the Proceedings of the 11th Annual Symposium on Frequency Control on May, 27 – 29th, 1963 (see FIG. 5 and its description on page 492 of the article). In the present circuit, $V_z$ of each of the zener diodes 31 to 35 is slightly different from one another. Thus, in FIG. 4, the zener voltages $V_z$'s of the zener diodes 31 to 35 are set equal to the output voltage $V_1 \approx V_5$, respectively, of the voltage control circuit 2, corresponding to $T_1°$ to $T_5$°C. As for the capacitors 41 to 45, the capacitance value of the capacitor 41, for example, is chosen so as to counteract the frequency change caused by the temperature change $T_1° \approx T_0°C$ (see the curve A in FIG. 4 representing the frequency-temperature characteristic without compensation). The capacitors 42 to 45 are chosen in like manner, when the temperature rises from $T_0°$ to $T_1°C$ at which the zener diode 31 becomes conductive to connect the capacitor 41 to the quartz crystal unit 5 in series, thereby lowering the oscillator frequency. When the temperature rises up to $T_2°C$ the zener diode 32 will operate to connect the capacitor 42. Similar operations will occur successively, resulting in the finally compensated frequency-temperature characteristic curve as shown by curve B of FIG. 4.

Figure 5:
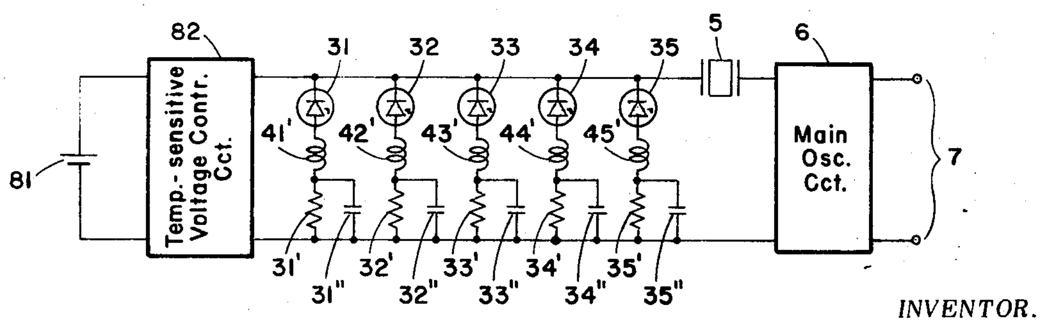
FIG. 5 is a circuit diagram showing another embodiment of this invention.
Figure 6:
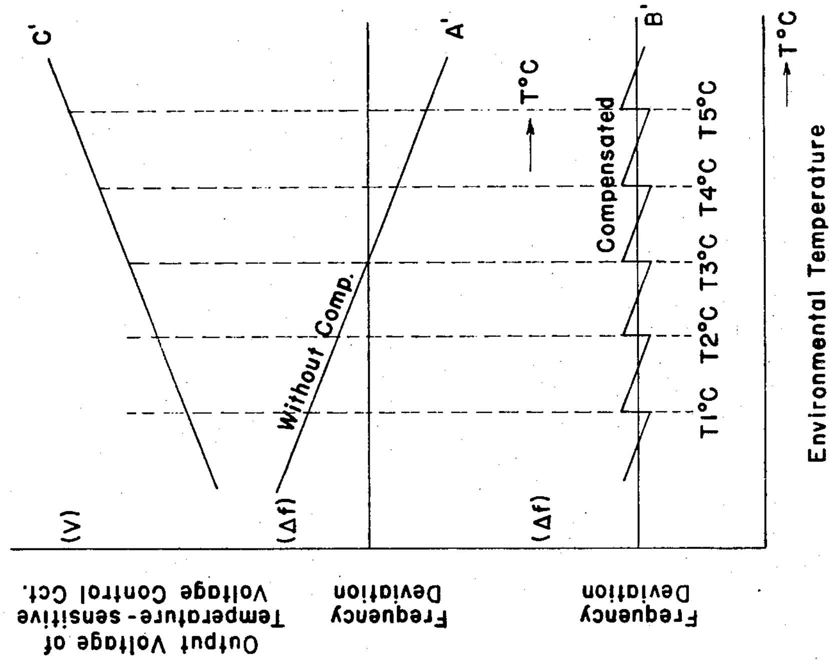
FIG. 6 is a diagram showing the frequency vs. temperature characteristic of the circuit of FIG. 5.

FIG. 5 illustrates another embodiment of this invention, whose frequency vs. temperature characteristic is shown in FIG. 6. Inductors 41' to 45' are used as reactance elements in the circuit of FIG. 5, in which those elements which have the same reference numerals as those of FIG. 4 act in the same manner, hence their detailed descriptions are omitted. Capacitors 31'' to 35'' provide a.c. bipass circuits for protection resistors 31' to 35'. As is well known, inductors connected in series to the quartz vibrator 5 act to lower the oscillator frequency, and therefore this arrangement can compensate the frequency-temperature characteristic curve A' of FIG. 6, which is opposite to the characteristic A of FIG. 4, the compensated result being represented by curve B' of FIG. 6.

Although the output voltages of the temperature-sensitive voltage control circuits shown in FIGS. 4 and 6 are both positive, it is possible to make those output voltages positive, thereby achieving a temperature compensation similar to that of FIG. 6 by the use of capacitors alone as reactance elements. In case that the frequency vs. temperature characteristic curve is quadratic, compensation can also be achieved by combining the embodiments of FIGS. 3 and 5. Further, by arranging the temperature-sensitive voltage control circuit so that its output voltage characteristic forms a quadratic, cubic or higher-order curve, the temperature compensation for various types of characteristics can be achieved (see the above-mentioned article).

In the temperature compensating circuit of this invention, the output voltage from the temperature-sensitive circuit does not directly control the oscillator frequency but merely participates in switching diodes, so the structure of the voltage divider can be very simple. Moreover, as the reactance element for compensating the oscillator frequency can be chosen at will, the controllable range is not limited as in the case of the variable-capacitance diodes of the prior art, but a wide-range compensation can be attained. Further, the value of the reactance element required for compensating at each temperature can be easily calculated to assure the accuracy of compensation without complicated adjustment. Although the compensation of the oscillator frequency is effectuated necessarily in a discrete manner, the resultant frequency ripple can be reduced by increasing the number of the semiconductor switching element — reactance element branches. Finally, the circuit of this invention is suitable for integration and microminiaturization as it comprises a plurality of similar semiconductor switching circuit — reactance element combinations.

What is claimed is:

1. An automatic frequency control for a reactance tuned oscillator, comprising:

a source of direct voltage having positive and negative terminals for providing a voltage of reference magnitude;

temperature sensitive means connected to said source positive and negative terminals and energized by said source voltage for producing a positive polarity output voltage having said reference magnitude and a further magnitude increasing thereabove in response to environmental temperature increases;

first reactance tuning means included in said oscillator and activated by said temperature means positive polarity output voltage having said reference magnitude for providing a corresponding amount of reactance to set the frequency of said oscillator at a predetermined value; and second reactance tuning means connected to said temperature means and first tuning means and including a plurality of semiconductor diodes, each connected in series with a reactor-resistor network; said diodes negative biased to different amounts above said source positive voltage reference magnitude to OFF states by said source voltage of negative polarity applied from said source negative terminal through said temperature means and network resistors to said diodes to disconnect said network reactors from said first tuning means as said temperature means positive polarity output voltage of said certain magnitude is applied to said first tuning means; said diodes turned ON in turn as said temperature means positive output voltage magnitude increases above said reference magnitude for overcoming said respective different amounts of biasing voltage in turn to connect said respective network reactors in turn in circuit with said first tuning means to provide respective step-amounts of reactance in turn to supplement said first tuning means reactance to further control the frequency of said oscillator to maintain the frequency deviation thereof at substantially zero value relative to said predetermined frequency value in response to said environmental temperature increases.

2. The automatic frequency control according to claim 1 in which said network reactors include discrete capacitors disconnected from said first tuning means as said diodes are in said OFF states and thereby rendered ineffective for supplementing said first tuning means reactance when said temperature means positive output voltage has said certain magnitude; said capacitors connected in turn in circuit with said first tuning means as said diodes are in said ON states in turn and thereby supplementing said first tuning means reactance as the magnitude of said temperature means positive output voltage increases above said certain magnitude to overcome said diode different amounts of biasing voltage in turn.

3. The automatic frequency control according to Claim 1 in which said network reactors include discrete inductors disconnected from said first tuning means as said diodes are in said OFF states and thereby rendered ineffective for supplementing said first tuning means reactance when said temperature means positive output voltage has said certain magnitude; said inductors connected in turn in circuit with said first tuning means as said diodes are in said ON states in turn and thereby supplementing said first tuning means reactance as the magnitude of said temperature means positive output voltage increases above said certain magnitude to overcome said diode different amounts of biasing voltage in turn.

4. The automatic frequency control according to claim 1 in which said respective diodes have first corresponding terminals connected in circuit with said source positive terminal and said first tuning means and also having other corresponding terminals connected to first corresponding terminals of said respective reactor-resistor networks whose other terminals are connected in circuit with said oscillator means and said source negative terminal.

5. The automatic frequency control according to claim 4 in which said reactors of said reactor-resistor networks are capacitors.

6. The automatic frequency control according to claim 4 in which said reactors of said reactor-resistor-resistor networks are inductors.

7. The automatic frequency control according to claim 4 in which said diodes are a zener type.

8. The automatic frequency control according to claim 4 in which said first tuning means includes a crystal; said diodes and network reactors being connected in circuit with said crystal.

9. An automatic frequency control for a reactance tuned oscillator, comprising:

- a source of direct voltage having positive and negative terminals for providing a voltage of reference magnitude;
- temperature sensitive means connected to said source positive and negative terminals and energized by said source voltage for producing a positive polarity output voltage having said reference magnitude and a further magnitude increasing thereabove in response to environmental temperature increases;
- a reactance tuning crystal included in said oscillator and activated by said temperature means positive output voltage having said reference magnitude for causing said crystal to produce a corresponding amount of reactance to set the frequency of said oscillator at a predetermined value; and
- Zener diode-capacitor-resistor tuning means for said oscillator, including a plurality of Zener diodes and parallel capacitor-resistor networks, each diode connected in series with one network; said respective diodes having first corresponding terminals connected in circuit with said source positive terminal and said crystal and also having other corresponding terminals connected to first corresponding terminals of said respective networks whose other terminals are connected to circuit with said source negative terminal and said oscillator for negative biasing of said diodes from said source negative terminal through said respective network resistors by different amounts of voltage above said source positive voltage reference magnitude to OFF states to disconnect said capacitors from said crystal when said temperature means positive output voltage of said certain magnitude is applied to said crystal and said diode first corresponding terminals; said diodes activated to ON states in turn as said temperature means positive output voltage magnitude increases above said reference magnitude to overcome said respective different amounts of biasing voltage in turn for connecting said respective capacitors in turn in circuit with said crystal to supplement said crystal reactance to vary the reactance tuning of said oscillator to maintain oscillator frequency deviation at a substantially zero value relative to said predetermined frequency value in response to said environmental temperature increases.

10. An automatic frequency control for a reactance tuned oscillator, comprising:

- a source of direct voltage having positive and negative terminals for producing a voltage of reference magnitude;
- temperature sensitive means connected to said source positive and negative terminals and energized by said source voltage for producing a positive polarity output voltage having said reference magnitude and a further magnitude increasing thereabove in response to environmental temperature increases;
- a reactance tuning crystal included in said oscillator and activated by said temperature means positive output voltage having said reference magnitude for causing said crystal to produce a corresponding amount of reactance to set the frequency of said oscillator at a predetermined value; and
- Zener diode-inductor-resistor tuning means for said oscillator, including a plurality of Zener diodes, inductors and resistors, each diode, inductor and resistor connected in series; said respective diodes having first corresponding terminals connected in circuit with said source positive terminal and said crystal and also having other corresponding terminals connected through associated inductors and resistors in circuit with said source negative terminal and said oscillator for negative biasing of said diodes by different amounts of voltage above said source positive voltage reference magnitude to OFF states to disconnect said inductors from said crystal when said temperature means positive output voltage of said certain magnitude is applied to said crystal and said diode first corresponding terminals; said diodes activated to ON states in turn as said temperature means positive output voltage magnitude increases above said reference magnitude to overcome said respective different amounts of biasing voltage in turn for connecting said respective inductors in turn in circuit with said crystal to supplement said crystal reactance to vary the reactance tuning of said oscillator to maintain oscillator frequency deviation at a substantially zero value relative to said predetermined frequency value in response to said environmental temperature increases.

* * * * *